(12) United States Patent
Lee et al.

(10) Patent No.: US 12,568,755 B2
(45) Date of Patent: Mar. 3, 2026

(54) DISPLAY DEVICE HAVING IMPROVED APERTURE RATIO AND RESOLUTION

(71) Applicant: LG Display Co., Ltd., Seoul (KR)

(72) Inventors: Mi-Kyoung Lee, Paju-si (KR); Ye-Oo Youn, Paju-si (KR); Min Gook, Paju-si (KR); Ju-Heon Hyeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 549 days.

(21) Appl. No.: 18/083,323

(22) Filed: Dec. 16, 2022

(65) Prior Publication Data

US 2023/0200191 A1     Jun. 22, 2023

(30) Foreign Application Priority Data

Dec. 17, 2021   (KR) ........................ 10-2021-0181736

(51) Int. Cl.
H10K 59/80          (2023.01)
H10K 59/126        (2023.01)

(52) U.S. Cl.
CPC ....... H10K 59/8793 (2023.02); H10K 59/126 (2023.02); H10K 59/873 (2023.02)

(58) Field of Classification Search
CPC ............. H10K 59/8793; H10K 59/126; H10K 59/873; H10K 59/8792; H10K 59/8791; H10K 50/865; H10K 50/844; G09F 9/30; G02B 1/08; G02B 1/14; G02F 1/1333; G02F 1/1335; G02F 1/133512; G02F 1/136209; B23B 7/023; B23B 7/12; C09J 11/00
See application file for complete search history.

(56) References Cited

U.S. PATENT DOCUMENTS

| | | | | |
|---|---|---|---|---|
| 11,177,458 B2 * | 11/2021 | Wang | .................... | H10K 77/111 |
| 2016/0092011 A1 * | 3/2016 | Kong | ....................... | G06F 3/045 |
| | | | | 345/174 |
| 2017/0194384 A1 * | 7/2017 | Zhou | ..................... | H10K 77/111 |
| 2018/0150105 A1 * | 5/2018 | Hwang | ................. | G06F 1/1637 |
| 2020/0403181 A1 * | 12/2020 | Jung | ...................... | H10K 59/87 |
| 2020/0411790 A1 * | 12/2020 | Wen | ....................... | H10K 50/865 |
| 2022/0011631 A1 * | 1/2022 | Beon | .................... | G02F 1/13363 |
| 2022/0354009 A1 * | 11/2022 | Zhang | ....................... | H05K 5/03 |

FOREIGN PATENT DOCUMENTS

| | | | | |
|---|---|---|---|---|
| CN | 104204921 A | 12/2014 | | |
| JP | WO2018128171 A1 * | 11/2019 | ............... | G09F 9/30 |
| JP | 6858912 B2 * | 4/2021 | ............. | B32B 27/08 |
| KR | 10-2017-0000031 A | 1/2017 | | |
| KR | 10-2017-0022624 A | 3/2017 | | |
| KR | 10-2017-0073918 A | 6/2017 | | |
| KR | 10-2017-0104378 A | 9/2017 | | |
| KR | 10-2018-0075779 A | 7/2018 | | |
| KR | 20180133874 A * | 12/2018 | ............... | G02B 5/30 |
| KR | 10-2021-0044920 A | 4/2021 | | |

* cited by examiner

*Primary Examiner* — Ida M Soward

(74) *Attorney, Agent, or Firm* — Birch, Stewart, Kolasch & Birch, LLP

(57)          ABSTRACT

A display apparatus can include a display panel displaying an image, a polarizing plate on the display panel, a front member on the polarizing plate, a protective film on the front member, and a first adhesive between the front member and the protective film, wherein the first adhesive includes at least one of a UV absorber and a light stabilizer.

36 Claims, 4 Drawing Sheets

DIS

<u>DIS</u>

| AF |
| HC |
| PF |
| ADH_3 |
| TCG |
| ADH_2 |
| POL |
| ADH_1 |
| PNL |

FIG. 4

DIS

| AF |
|---|
| HC |
| PF |
| ADH_3 |
| TCG |
| ADH_2 |
| POL |
| ADH_1 |
| PNL |

BM

BUF t2 t1

FIG. 5

DIS

| AF |
|---|
| HC |
| PF |
| ADH_2 |
| TCG |
| POL |
| ADH_1 |
| PNL |

BM

ADL t2 t1

DIS

| |
|---|
| AF |
| HC |
| TCF |
| ADH_3 |
| TF |
| ADH_2 |
| POL |
| ADH_1 |
| PNL | t2 — ADH_3

— BM t1 — ADH_2

DIS

| |
|---|
| AF |
| HC |
| TCF |
| BUF |
| ADH_3 |
| TF |
| ADH_2 |
| POL |
| ADH_1 |
| PNL | t2 — BUF

— BM t1 — ADH_2

DISPLAY DEVICE HAVING IMPROVED APERTURE RATIO AND RESOLUTION

CROSS-REFERENCE TO RELATED APPLICATIONS

The present application claims the priority benefit under 35 U.S.C. § 119(a) to Korean Patent Application No. 10-2021-0181736, filed in Republic of Korea on Dec. 17, 2021, the entire contents of which are hereby expressly incorporated herein by reference into the present application.

BACKGROUND OF THE INVENTION

Field of the Invention

The present disclosure relates to a display apparatus, and more particularly, to a display apparatus capable of minimizing an influence of external light such as ultraviolet (UV) light.

Discussion of the Related Art

Recently, with a development of multimedia displays, an importance of a flat display apparatus has increased. In response to this development, flat display apparatuses such as a liquid crystal display apparatus and an organic electroluminescent display apparatus have been commercialized.

Among these flat display apparatuses, the organic electroluminescent display apparatus is currently widely used and offers advantages such as high response speed, high luminance and good viewing angle.

Various films can be attached to the organic electroluminescent display apparatus to enhance tolerance and sturdiness, and to prevent contamination. Such films are attached to the display apparatus by an adhesive. However, since the adhesive is vulnerable to an ultraviolet (UV) ray, when the finished display apparatus is used under sunlight, the adhesive can be exposed to the UV ray of the sunlight, and cracks can occur in the adhesive. As such, there can be a limitation that the film can be peeled by the cracks.

SUMMARY OF THE DISCLOSURE

Accordingly, the present disclosure is directed to a display apparatus that substantially obviates or addresses one or more of the limitations and disadvantages associated with the related art.

An advantage of the present disclosure is to provide a display apparatus which includes a UV absorber and/or a light stabilizer in an adhesive to block a UV ray included in an external light and can prevent the adhesive from being damaged by the UV ray.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display apparatus includes: a display panel displaying an image; a polarizing plate on the display panel; a front member on the polarizing plate; a protective film on the front member; and a first adhesive between the front member and the protective film, wherein the first adhesive includes a UV absorber and/or a light stabilizer.

In another aspect, a display apparatus includes: a display panel displaying an image; a polarizing plate on the display panel; a first film on the polarizing plate; a second film on the first film; and a first adhesive between the first film and the second film, wherein the first adhesive includes a UV absorber and/or a light stabilizer.

According to another aspect, a display apparatus includes a plurality of layers including a display panel, a polarizing plate, a front member, and a protective film; and at least two of a first adhesive, a second adhesive, a buffer layer and an adhesive layer each having an ultraviolet (UV) absorber and a light stabilizer included in different amounts, wherein a thickness of first of the at least two is different from a thickness of second of the two.

It is to be understood that both the foregoing general description and the following detailed description are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIG. 4 is a cross-sectional view illustrating a display apparatus according to another embodiment of the present disclosure;

FIG. 5 is a cross-sectional view illustrating a display apparatus according to yet another embodiment of the present disclosure;

DETAILED DESCRIPTION OF THE EMBODIMENTS

Figures 1, 2:
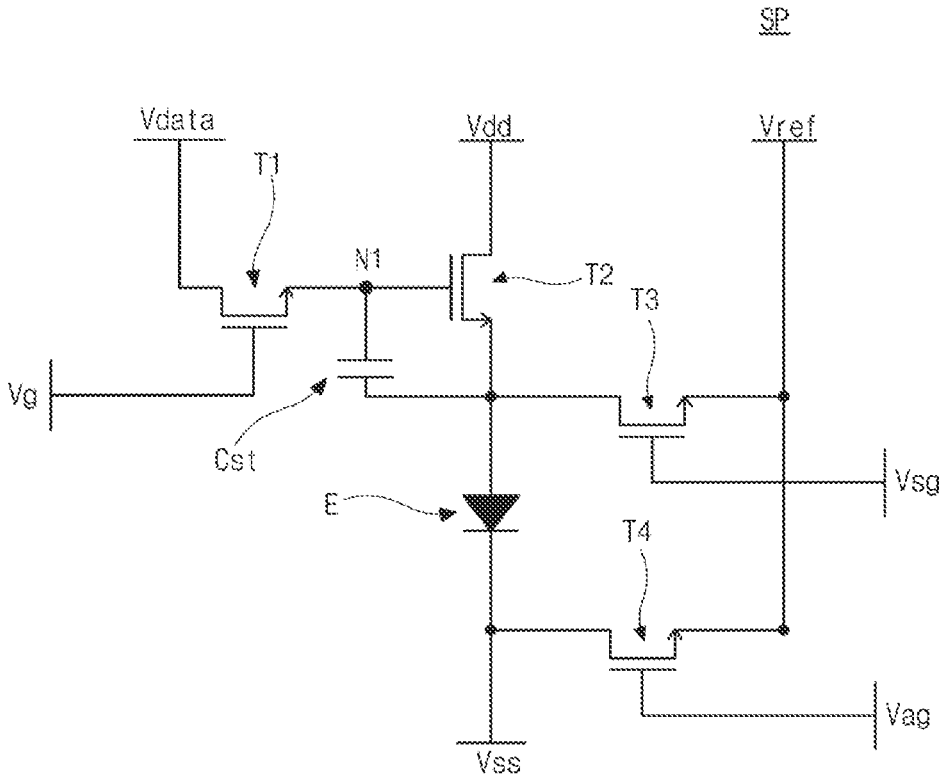
FIG. 1 is a circuit diagram of an organic electroluminescent display panel provided in a display apparatus according to an embodiment of the present disclosure.
FIG. 2 is a cross-sectional view illustrating a display apparatus according to an embodiment of the present disclosure.

Advantages and features of the present disclosure and methods of achieving them will be apparent with reference to the embodiments described below in detail with the accompanying drawings. However, the present disclosure is not limited to the embodiments disclosed below, but can be realized in a variety of different forms, and only these embodiments allow the present disclosure to be complete. The present disclosure is provided to fully inform the scope of the disclosure to the skilled in the art of the present invention.

The shapes, sizes, proportions, angles, numbers, and the like disclosed in the drawings for explaining the embodiments of the present disclosure are illustrative, and the present disclosure is not limited to the illustrated matters. The same reference numerals refer to the same components throughout the description.

Furthermore, in describing the present disclosure, if it is determined that a detailed description of the related known technology unnecessarily obscure the subject matter of the present disclosure, the detailed description thereof can be omitted. When 'comprising', 'including', 'having', 'consisting', and the like are used in this disclosure, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', 'next', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

Respective features of various embodiments of the present disclosure can be partially or wholly connected to or combined with each other and can be technically interlocked and driven variously, and respective embodiments can be independently implemented from each other or can be implemented together with a related relationship.

In describing components of the present disclosure, terms such as first, second, A, B, (a), (b) and the like can be used. These terms are only for distinguishing the components from other components, and an essence, order, order, or number of the components is not limited by the terms. Further, when it is described that a component is "connected", "coupled" or "contact" to another component, the component can be directly connected or contact another component, but it should be understood that other component can be "interposed" between the components or the components can be "connected," "coupled," or "contact" through one or more other components.

In this disclosure, a "display apparatus" can include a display apparatus in a narrow sense, such as a display module including a display panel and a driving portion for driving the display panel, or can include a display module, and/or an application product including the display module or a set device that is an end-user device. Furthermore, the "display apparatus" can include a complete product or final product which is a notebook computer, a television, a computer monitor, an automotive device or equipment display including other type of vehicle, or a set electronic device or set device or set apparatus such as a mobile electronic device which is a smart phone, an electronic pad or the like. The "display apparatus" can be any module, unit, device, apparatus, component, etc. or a part thereof, that can provide a displaying operation.

Further, all the components of each display apparatus according to all embodiments of the present disclosure are operatively coupled and configured. In this regard, each display apparatus of the present disclosure includes components/layers needed to provide a display function as well understood to one skilled in the art. For instance, a display panel of each display apparatus of the present disclosure can include various elements such as pixel/sub-pixel configurations and one or more components for driving the pixel/subpixel configurations. Further, each display panel can also provide a touch function in addition to the display function. In addition, various examples of an adhesive (e.g., ADH, ADH_1, ADH_2, ADH_3. etc.) can be an adhesive material or layer or film.

Hereinafter, the present disclosure is described with reference to accompanying drawings.

The present disclosure can be applied to various display apparatuses. For example, the present disclosure can include a liquid crystal display apparatus, an organic light emitting display apparatus, an electrophoretic display apparatus, a mini light emitting diode (mini LED) display apparatus, and a micro light emitting diode (micro LED) display apparatus. However, hereinafter, for convenience of explanations, an organic electroluminescent display apparatus is described by way of example. Further, all components of each organic electroluminescent display panel according to all embodiments of the present disclosure are operatively coupled and configured.

FIG. 1 is a circuit diagram of an organic electroluminescent display panel provided in a display apparatus according to an embodiment of the present disclosure.

The organic electroluminescent display panel according to the present disclosure can include a display area and a pad area. The display area can include a plurality of sub-pixels SP. Each sub-pixel SP can display a single color in the organic electroluminescent display apparatus. For example, each sub-pixel SP can display any one of red, green, blue, and white. In this case, the red, green, blue, and white sub-pixels SP can be defined to form one pixel. The plurality of sub-pixels SP can be arranged in a matrix on the substrate of the organic electroluminescent display apparatus, and a plurality of lines can be disposed between the plurality of sub-pixels SP in the display area.

In addition, various lines electrically connected to the lines disposed in the display area and for applying signals to a light emitting element E of the organic electroluminescent display apparatus can be disposed in the pad area. The lines in the pad area can include, for example, a Vdd line, a Vdata line, a reference (Vref) line, and a Vss line, but are not limited thereto.

As shown in FIG. 1, each sub-pixel SP can include a switching thin film transistor T1, a driving thin film transistor T2, a storage capacitor Cst, a sensing thin film transistor T3, an auxiliary thin film transistor T4, and a light emitting element E. Since the sub-pixel SP of the organic electroluminescent display apparatus according to the present disclosure includes four thin film transistors and one capacitor, it can be referred to as a 4T1C structure. However, the structure of the sub-pixel SP of the organic electroluminescent display apparatus according to the present disclosure is not limited thereto, and can be configured in various compensation structures such as a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors included in the sub-pixel SP can include a semiconductor layer, a gate electrode, a source electrode, and a drain electrode, and can be a P-type thin film transistor or an N-type thin film transistor. FIG. 2 shows an N-type thin film transistor for convenience of explanation.

The switching thin film transistor T1 can include a drain electrode connected to a data line, a source electrode connected to a first node N1, and a gate electrode connected to a gate line. The switching thin film transistor T1 can be turned on based on a gate voltage Vg applied from a gate driver to the gate wiring, and can charge a data voltage Vdata, which is applied to the data line from a data driver, to the first node N1.

The driving thin film transistor T2 can include a drain electrode connected to a high potential line (e.g., a Vdd line), a source electrode connected to an anode of the light emitting element E, and a gate electrode connected to the first node N1. The driving thin film transistor T2 can be turned on when the voltage of the first node N1 is higher than a threshold voltage (Vth), and can be turned off when the voltage of the first node N1 is lower than the threshold voltage (Vth). The driving thin film transistor T2 can transfer a driving current received from the Vdd line to the light emitting element E.

The storage capacitor Cst can include an electrode connected to the first node N1 and an electrode connected to the source electrode of the driving thin film transistor T2. The storage capacitor Cst can maintain a potential difference between the gate electrode and the source electrode of the driving thin film transistor T2 during an emission time during which the light emitting element E emits light, thereby providing a constant driving current to the light emitting element E.

The sensing thin film transistor T3 can include a drain electrode connected to the source electrode of the driving thin film transistor T2, a source electrode connected to the reference line, and a gate electrode connected to a sensing gate line and supplied with a sensing gate voltage Vsg. The sensing thin film transistor T3 can be a thin film transistor for sensing the threshold voltage of the driving thin film transistor T2.

The auxiliary thin film transistor T4 can include a drain electrode electrically connected to a cathode of the light emitting element E, a source electrode electrically connected to the reference line, and a gate electrode electrically connected to an auxiliary gate line and supplied with an auxiliary gate voltage Vag. The auxiliary thin film transistor T4 can be turned off in the emission time, and when the auxiliary thin film transistor T4 is turned on, it can transfer the reference voltage Vref to the cathode of the light emitting element E.

FIG. 2 is a cross-sectional view illustrating a display apparatus according to an embodiment of the present disclosure. All components of each display apparatus according to all embodiments of the present disclosure are operatively coupled and configured.

As shown in FIG. 2, the display apparatus DIS can include a plurality of layers including one or more of a display panel PNL on which an actual image is displayed, a polarizing plate POL disposed on the display panel PNL to prevent reflection of external light incident from an outside, a front member TCG disposed on the polarizing plate POL, a protective film PF disposed on the front member TCG, and a coating layer HC and a functional layer AF disposed on the protective film PF.

The polarizing plate POL can be attached to the display panel PNL by a first adhesive ADH_1. The front member TCG can be attached to the polarizing plate POL by a second adhesive ADH_2. The protective film PF can be attached to the front member TCG by a third adhesive ADH_3. In addition, the coating layer HC can be directly laminated on the protective film PF, and the functional layer AF can be directly laminated on the coating layer HC.

The display panel PNL can be a liquid crystal display panel, an organic electroluminescent display panel, an electrophoretic display panel, a mini LED display panel, or a micro LED display panel. Other types of a display panels, such as electronic paper or electroluminescent display can also be used. The organic electroluminescent display panel is described below.

Figure 3:
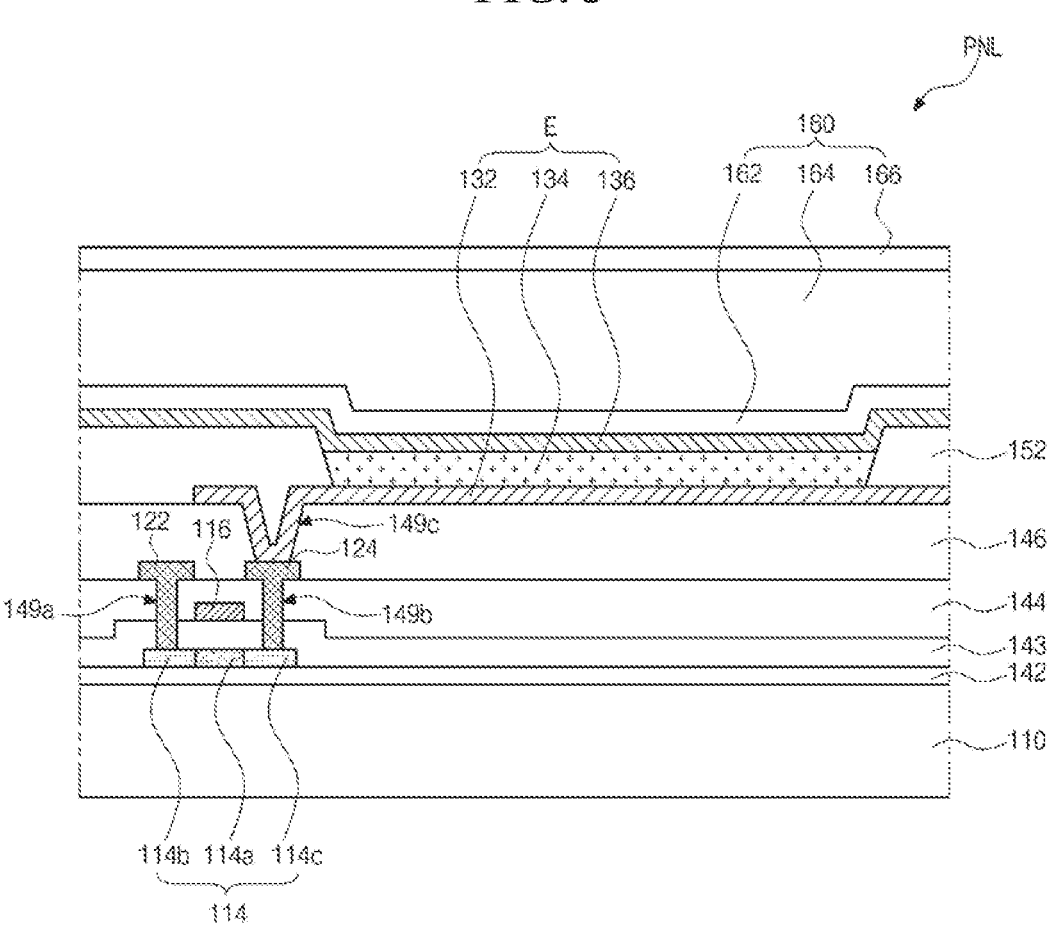
FIG. 3 is a cross-sectional view illustrating a display panel according to an embodiment of the present disclosure.

FIG. 3 is a cross-sectional view illustrating a display panel according to an embodiment of the present disclosure. Although the display panel PNL substantially includes a plurality of sub-pixels, one sub-pixel is illustrated in FIG. 3 for convenience of explanations.

As shown in FIG. 3, a thin film transistor T can be disposed on a substrate 110. Various thin film transistors such as a switching thin film transistor, a driving thin film transistor, a sensing thin film transistor, and an auxiliary thin film transistor can be disposed in each sub-pixel of the display panel PNL, but one thin film transistor T is shown in FIG. 3 for convenience of explanations. Accordingly, the thin film transistor T can be a switching thin film transistor, a driving thin film transistor, a sensing thin film transistor, or an auxiliary thin film transistor.

For example, since the switching thin film transistor, the driving thin film transistor, the sensing thin film transistor, and the auxiliary thin film transistor can all have the same structure, structures of all these thin film transistors can be expressed with one thin film transistor T in FIG. 3.

As shown in FIG. 3, the thin film transistor T can include a semiconductor layer 114 formed on a buffer layer 142 which is formed on the substrate 110, a gate insulating layer 143 stacked on the buffer layer 142 to cover the semiconductor layer 114, a gate electrode 116 disposed on the gate insulating layer 143, an inter-layered insulating layer 144 stacked on the gate insulating layer 143 to cover the gate electrode 116, and a source electrode 122 and a drain electrode 124 disposed on the inter-layered insulating layer 144.

The substrate 110 can be made of a foldable plastic material. For example, the substrate 110 can use polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC). However, the substrate 110 of the present disclosure is not limited to such the plastic material, but can be made of a foldable thin glass or other materials, including organic or inorganic materials, or combination of materials, including metals.

The buffer layer 142 can protect the thin film transistor T formed in a subsequent process from impurities such as alkali ions leaking from the substrate 110 or block moisture that can penetrate from an outside. The buffer layer 142 can be formed of a single layer of silicon oxide (SiOx) or silicon nitride (SiNx) or multi layers using silicon oxide (SiOx) and silicon nitride (SiNx). Other oxides, nitrides or organic material can be used for the buffer layer 142, including a multi-layer of a combination of inorganic/organic stacks, or stacks of several inorganic layers or stacks of organic layers. The semiconductor layer 114 can be formed of an amorphous semiconductor such as amorphous silicon (a-Si), a crystalline semiconductor such as polycrystalline silicon (p-Si), or an oxide semiconductor such as indium gallium zinc oxide (IGZO). The semiconductor layer 114 can include a channel region 114a of a central region, and a source region 114b and a drain region 114c which are doped regions at both sides of the semiconductor layer 114.

The gate electrode 116 can be formed of a single layer or a plurality of layers using a metal(s) such as Cr, Mo, Ta, Cu, Ti, Al, and/or an Al alloy, but is not limited thereto. In various embodiments of the present disclosure, reference to the term "and/or" refers to at least one in the group including the item. For example, Cr, Mo, Ta, Cu, Ti, Al, and/or an Al alloy is equivalent to at least one of Cr, Mo, Ta, Cu, Ti, Al, and an Al alloy.

The inter-layered insulating layer 144 can be formed of a single layer or a plurality of layers using an organic material such as photoacrylic or an inorganic material such as SiNx or SiOx. In addition, the inter-layered insulating layer 144 can be formed of a plurality of layers of the organic material layer and the inorganic material layer.

The source electrode 122 and the drain electrode 124 can be formed of a single layer or a plurality of layers using a metal(s) such as Cr, Mo, Ta, Cu, Ti, Al, and/or an Al alloy, but is not limited thereto. Other conductive materials can be used, such an conductive oxides.

The source electrode 122 and the drain electrode 124 can be in ohmic contact with the source region 114*b* and the drain region 114*c* of the semiconductor layer 114 through a first contact hole 149*a* and a second contact hole 149*b* formed in the gate insulating layer 143 and the inter-layered insulating layer 144, respectively.

Although not shown in the drawings, a bottom shield metal layer can be disposed below the semiconductor layer 114 and on the substrate 110. The bottom shield metal layer can minimize a back channel phenomenon caused by charges trapped in the substrate 110 to prevent afterimages or deterioration of a transistor performance. The bottom shield metal layer can be formed of a single layer or a plurality of layers using titanium (Ti), molybdenum (Mo) and/or an alloy of Ti and Mo, but is not limited thereto.

A passivation layer 146 can be formed on the substrate 110 on which the thin film transistor T is disposed. The passivation layer 146 can be formed of an organic material such as photoacrylic, but is not limited thereto, and can include a plurality of layers including an inorganic layer and an organic layer. A third contact hole 149*c* can be formed in the passivation layer 146.

An anode 132 electrically connected to the drain electrode 124 of the thin film transistor T through the third contact hole 149*c* can be formed on the passivation layer 146. The anode 132 can be formed of a single layer or a plurality of layers using a metal(s) such as Ca, Ba, Mg, Al, Ag and/or an alloy thereof, and can be connected to the drain electrode 124 of the thin film transistor T. Other materials that are conductive can be used.

A bank layer 152 can be formed at a boundary of each sub-pixel on the passivation layer 146. The bank layer 152 can be a type of a separation wall defining each sub-pixel. The bank layer 152 can partition the sub-pixels SP to prevent light of a specific color, which is output from adjacent pixels, from being mixed and output.

An organic light emitting layer 134 can be formed on the anode 132 and on a portion of an inclined surface of the bank layer 152. The organic light-emitting layer 134 can be an R organic light emitting layer which is formed in an R sub-pixel to emit red light, a G organic light emitting layer which is formed in an G sub-pixel to emit green light, or a B organic light emitting layer which is formed in a B sub-pixel to emit blue light. Alternatively, the organic light emitting layer 134 can be a W organic light emitting layer emitting a white light. Other colors or combination of colors can be used, such as yellow-green, or even wavelengths or light that are not visible, such a ultraviolet light that can be down converted to produce a color.

The organic light emitting layer 134 can include not only a light emitting layer, but also an electron injection layer and a hole injection layer for respectively injecting electrons and holes into the light emitting layer, and an electron transport layer and a hole blocking layer for transporting injected electrons to the light emitting layer, and an electron blocking layer and a hole transport layer for transporting injected holes to the light emitting layer, but is not limited thereto.

A cathode 136 can be formed on the organic light emitting layer 134 and over the entire display apparatus 100. The cathode 136 can be made of a transparent conductive material such as indium tin oxide (ITO) or indium zinc oxide (IZO), or a thin metal through which visible light is transmitted, but is not limited thereto.

The anode 132, the organic light emitting layer 134, and the cathode 136 can form a light emitting element E to output light having a specific wavelength as a signal is applied.

An encapsulation layer 160 can be formed on the cathode 136. The encapsulation layer 160 can include a first encapsulation layer 162 made of an inorganic material, a second encapsulation layer 164 made of an organic material, and a third encapsulation layer 166 made of an inorganic material. For example, the inorganic material can include, but is not limited to, SiNx and SiOx. In addition, the organic material can include, but is not limited to, polyethylene terephthalate, polyethylene naphthalate, polycarbonate, polyimide, polyethylene sulfonate, polyoxymethylene, polyarylate, or a mixture thereof.

Referring to FIG. 2, the polarizing plate POL can be disposed on the display panel PNL. The polarizing plate POL can prevent reflection of light input from an outside to improve visibility of the display apparatus DIS. The polarizing plate POL can transmit only light in a specific polarization direction among an external light incident from the outside and absorb a remaining light, and the light transmitted through the polarizing plate POL can be reflected by the display panel PNL and then can be incident on the polarizing plate POL again. At this time, since the polarization direction of the reflected external light is changed, the light incident back to the polarizing plate POL can be absorbed by the polarizing plate POL and may not be output to the outside, so that a reflection of the external light can be prevented.

The polarizing plate POL can be a circular polarizing plate. As such, when a circular polarizing plate is used, a retardation film of $\lambda/4$ can be further provided between the polarizing plate POL and the display panel PNL.

The polarizing plate POL can be formed of a polymer film mainly composed of a polyvinyl alcohol (PVA)-based resin containing iodine or dichroic dye, and protective films on both surfaces thereof. In this case, the iodine or the dichroic dye is uniaxially stretched to be aligned in one direction. Alternatively, the polarizing plate POL can use a material other than the PVA-based resin. For example, an O-type polarizer in which a liquid crystal composition containing a dichroic material and a liquid crystal compound is oriented in a predetermined direction, and/or an E-type polarizing material in which a lyotropic liquid crystal is aligned in a predetermined direction can be used.

The protective film of the polarizing plate POL can be formed of a transparent film without phase retardation, and can protect the polymer film from external moisture or contamination. As the protective film, triacetyl cellulose (TAC), polyethylene terephthalate (PET), cycloolefin polymer (COP), or a combination thereof can be used, but is not limited thereto.

The front member TCG can transmit an image of the display panel PNL to the outside as it is, and can protect the display panel PNL from external impact, and external environment or stress. The protective film PF can be attached to the front member TCG by the third adhesive ADH_3. Since the front member TCG can be formed with a thin thickness of several tens of micrometers, the front member TCG can be damaged by a small external impact or continuous folding. The protective film PF can protect the front member TCG from compressive stress and elongational stress caused by external impact or continuous folding. In addition, when the front member TCG is damaged by an external impact or stress to generate glass powder, the protective film PF can prevent the glass powder from scattering to the outside.

As the protective film PF, a film such as polyethylene terephthalate can be mainly used, but is not limited thereto, and triacetyl cellulose, cycloolefin polymer (COP), or a combination thereof can be used.

A black matrix BM can be formed on an edge of the protective film PF to prevent light output from the display panel PNL from leaking to the edge of the display apparatus DIS. The black matrix BM can be formed of a metal oxide such as CrOx, a black resin, or a black ink, but is not limited thereto.

The coating layer HC can be laminated on the protective film PF to protect the display apparatus DIS from scratches. The coating layer HC can be formed by laminating an organic material such as a urethane acrylic resin, a methacrylic resin, or a silsesquioxane compound, but is not limited thereto.

The functional layer AF can be formed by being laminated on the coating layer HC or can be formed by surface-treating a top surface of the coating layer HC. The functional layer AF can include, but is not limited to, an anti-fingerprint layer, an anti-contamination layer, and/or an anti-glare layer. For example, the functional layer AF can include at least one of an anti-fingerprint layer, an anti-contamination layer, and an anti-glare layer.

The anti-fingerprint layer can be formed by using a method that increases a wetness of the coating layer HC so that the wetness is not noticeable even if a fingerprint component is attached. The anti-fingerprint layer can be formed by laminating an organic material having water repellency and oil repellency, such as a fluorine-based polymer.

The anti-contamination layer can be formed by laminating a material having good water repellency, such as a hydrocarbon compound, a silicone compound, a chlorine compound, and/or a fluorine compound, but is not limited thereto.

The anti-glare layer can be formed by thinly coating silicon oxide (SiOx) on the coating layer HC by a spray method or by single or double surface treatment of the coating layer (HC) to generate a scattering effect.

The first adhesive ADH_1 for bonding the display panel PNL and the polarizing plate POL can mostly use an acrylic adhesive material because it has good transparency, but it is not limited thereto. Various other adhesive materials can be used.

The second adhesive ADH_2 for bonding the polarizing plate POL and the front member TCG and the third adhesive ADH_3 for bonding the front member TCG and the protective film PF can use an acrylic, silicone or urethane adhesive material containing an ultraviolet (UV) absorber and/or a light stabilizer.

The UV absorber and the light stabilizer can absorb light incident to the second adhesive ADH_2 and the third adhesive ADH_3 from the outside or prevent the second adhesive ADH_2 and the third adhesive ADH_3 from being exposed to UV rays. The reason why the second adhesive ADH_2 and the third adhesive ADH_3 contain the UV absorber and/or the light stabilizer is as follows.

The display apparatus DIS, for example, a foldable display apparatus, is mainly used by application to a smart phone, and the smart phone is used both indoors and outdoors. When used outdoors, an external light is continuously irradiated to an inside of the display apparatus DIS. For example, as UV rays are irradiated into the inside of the display apparatus DIS, the first to third adhesives ADH_1 to ADH_3 are over-hardened and thus damages such as cracks occurs in the first to third adhesives ADH_1-ADH_3. Due to the damages of the first to third adhesives ADH_1 to ADH_3, peeling between the display panel PNL and the polarizing plate POL, peeling between the polarizing plate POL and the front member TCG, and peeling between the front member TCG and the protective film PF occur.

In order to solve the peeling problem, a separate UV blocking layer might be formed on the third adhesive ADH_3 to block UV rays incident into the display apparatus DIS. However, in this case, thickness and weight of the display apparatus DIS are increased by the separate UV blocking layer. Moreover, since an increase of the thickness of the foldable display device DIS not only increases a folding curvature, but also increases a stress when folding and unfolding, a fatal problem occurs in implementing the foldable display apparatus DIS.

In the present disclosure, the first to third adhesives ADH_1 to ADH_3 include the UV absorber and/or light stabilizer to absorb UV rays or prevent the adhesive material from being exposed to UV rays, so that damages to the first to third adhesives ADH_1 to ADH_3 can be prevented. Accordingly, since a separate UV blocking layer is not required, an increase in a thickness of the display apparatus DIS can be prevented.

In this disclosure, the first adhesive ADH_1 may not contain the UV absorber and/or the light stabilizer, and the second adhesive ADH_2 and the third adhesive ADH_3 can contain the UV absorber and/or the light stabilizer. This case can be because when the display apparatus DIS is used outdoors, an external light is not only filtered by the polarizing plate POL but also absorbed by upper layers (i.e., the protective layer PF and the front member TCG), thus an amount of UV rays incident to the first adhesive ADH_1 is greatly reduced, and thus the first adhesive ADH_1 is not over-hardened.

According to the embodiment of the present disclosure, depending on the structure of the display apparatus DIS, the UV absorber and/or light stabilizer can be included only in the third adhesive ADH_3 and the UV absorber or the light stabilizer may not be included in the second adhesive ADH_2.

In addition, when the second adhesive ADH_2 and the third adhesive ADH_3 contain the UV absorber and/or the light stabilizer, a portion of UV rays is absorbed by the protective layer PF and the front member TCG, and thus an amount of UV rays irradiated to the second adhesive ADH_2 is lower than an amount of UV rays irradiated to the third adhesive ADH_3. Thus, an amount of the UV absorber and/or light stabilizer included in the second adhesive ADH_2 can be less than an amount of the UV absorber and/or light stabilizer in the third adhesive ADH_3.

The UV absorber absorbs energy from UV rays and converts UV energy into heat through reversible chemical rearrangement and loses it. The UV absorber can use 2-methylphenyl 4-methylbenzoate, but is not limited thereto. The UV absorber can use a benzotriazol based material, a benzophenone based material, an oxalic acid anilide based material, and/or a cyaniacrylate based material.

The light stabilizer can use an amine based light stabilizer (e.g., hindered amine light stabilizer) of a Tinuvin 000 based material. Thus, the light stabilizer absorbs alkyl radicals and peroxide radicals generated by exposure to UV rays and stops a chain reaction, thereby preventing damages, such as cracks, of the second adhesive ADH_2 and the third adhesive ADH_3.

The UV absorber and the light stabilizer can be separately included in the second adhesive ADH_2 and the third adhesive ADH_3, but both of the UV absorber and the light stabilizer can be included in the second adhesive (ADH_2) and the third adhesive (ADH_3). For example, derivatives such as TMP (2,2,6,6-tetramethyl piperidine) can be used for the second adhesive ADH_2 and the third adhesive ADH_3, but is not limited thereto.

The second adhesive ADH_2 can be formed to have a thickness t1, 50 μm≤t1≤100 μm. When the thickness t1 of the second adhesive ADH_2 is less than 50 μm, a folding performance of the display apparatus DIS is deteriorated, and when the thickness t1 exceeds 100 μm, there is no effect due to the increase in thickness and only the thickness of the display apparatus DIS is increased.

The second adhesive ADH_2 can include 3-5 wt % of the UV absorber or 0.5-1 wt % of the light stabilizer in an adhesive material. For example, based on 100 wt % of the second adhesive ADH_2, the UV absorber can be included in an amount of 3-5 wt %. For example, based on 100 wt % of the second adhesive ADH_2, the light stabilizer can be included in an amount of 0.5-1 wt %. In addition, the second adhesive ADH_2 can include 3-5 wt % of the UV absorber and 0.5-1 wt % of the light stabilizer in an adhesive material.

When the UV absorber is included in an amount of less than 3 wt % in the second adhesive ADH_2, all incident UV rays cannot be absorbed, and thus the second adhesive ADH_2 is over-hardened by UV rays. In addition, when the UV absorber is included in an amount exceeding 5 wt % in the second adhesive ADH_2, an adhesive strength of the second adhesive ADH_2 is lowered, and thus the front member TCG can be separated from the polarizing plate POL.

When the light stabilizer is included in an amount of less than 0.5 wt % in the second adhesive ADH_2, the second adhesive ADH_2 is exposed to incident UV rays and the second adhesive ADH_2 is over-hardened by UV rays. In addition, when the light stabilizer is included in an amount exceeding 1 wt % in the second adhesive ADH_2, an adhesive strength of the second adhesive ADH_2 is lowered, and thus the front member TCG can be separated from the polarizing plate POL.

The third adhesive ADH_3 can be formed to have a thickness t2, 20 μm≤t2≤70 μm. When the thickness t2 of the third adhesive ADH_3 is less than 20 μm, an adhesive strength is lowered and the protective film PF can be peeled off from the front member TCG, and when it exceeds 70 μm, a folding performance is deteriorated.

The third adhesive ADH_3 can contain 8-10 wt % of the UV absorber or 1-1.5 wt % of the light stabilizer in an adhesive material. For example, based on 100 wt % of the third adhesive ADH_3, the UV absorber can be included in an amount of 8-10 wt %. For example, based on 100 wt % of the third adhesive ADH_3, the light stabilizer can be included in an amount of 0.5-1 wt %. In addition, the third adhesive ADH_3 can include 8-10 wt % of the UV absorber and 1-1.5 wt % of the light stabilizer in an adhesive material.

When the UV absorber is included in an amount of less than 8 wt % in the third adhesive ADH_3, all incident UV rays cannot be absorbed, and thus the third adhesive ADH_3 is over-hardened by UV rays. In addition, when the UV absorber is included in an amount exceeding 10 wt % in the third adhesive ADH_3, an adhesive strength of the third adhesive ADH_3 is lowered, and thus the protective film PF can be separated from the front member TCG.

When the light stabilizer is included in an amount of less than 1 wt % in the third adhesive ADH_3, the third adhesive ADH_3 is exposed to incident UV rays, and thus the third adhesive ADH_3 is over-hardened by UV rays. In addition, when the light stabilizer is included in an amount exceeding 1.5 wt % in the third adhesive ADH_3, and adhesive strength of the third adhesive ADH_3 is lowered, and thus the protective film PF can be separated from the front member TCG.

According to the embodiment of the present disclosure, the UV absorber and/or the light stabilizer is included in the third adhesive ADH_3, which is an outermost adhesive of the display apparatus DIS, to absorb UV rays incident from an outside or not to expose the adhesive material to UV rays, so that defects due to over-hardening of the third adhesive ADH_3 can be prevented.

In addition, in the display apparatus DIS according to the embodiment of the present disclosure, the second adhesive ADH_2 located at an inner side than the outermost adhesive also contains the UV absorber and/or the light stabilizer to prevent defects due to over-hardening of the second adhesive ADH_2. Thus, in the embodiment of the present disclosure of FIG. 2, an outermost structure containing the UV absorber and/or the light stabilizer is the third adhesive ADH_3, which is located closer to the display panel PNL than the black matrix BM, and layers such as front member TCG, and the polarization plate POL located to the interior of the display apparatus DIS are protected from UV rays by the third adhesive ADH_3. The polarization plate POL is further protected from the UV rays by the second adhesive ADH_2 containing the UV absorber and/or the light stabilizer. As shown in the embodiment of FIG. 2, both of the third adhesive ADH_3 and the second adhesive ADH_2 containing the UV absorber and/or the light stabilizer are located to the interior of the black matrix BM in FIG. 2.

FIG. 4 is a view illustrating a display apparatus according to another embodiment of the present disclosure. Explanations of the same components as those of the embodiment shown in FIG. 2 can be omitted or simplified, and other structures can be explained in detail.

As shown in FIG. 4, the display apparatus DIS according to another embodiment of the present disclosure can include a display panel PNL on which an image is displayed, a polarizing plate POL disposed on the display panel PNL to prevent reflection of external light incident from an outside, a front member TCG disposed on the polarizing plate POL, a protective film PF disposed on the front member TCG, and a coating layer HC and a functional layer AF disposed on the protective film PF.

The polarizing plate POL can be attached to the display panel PNL by a first adhesive ADH_1, the front member TCG can be attached to the polarizing plate POL by a second adhesive ADH_2, and the protective film PF can be attached to the front member TCG by a third adhesive ADH_3. In addition, the coating layer HC can be directly laminated on the protective film PF, and the functional layer AF can be directly laminated on the coating layer HC.

The first adhesive ADH_1 for bonding the display panel PNL and the polarizing plate POL and the second adhesive ADH_2 for bonding the polarizing plate POL and the front member TCG can be, but not limited to, an acrylic, silicone, or urethane-based adhesive material.

In addition, the third adhesive ADH_3 for bonding the front member TCG and the protective film PF can use, but not limited to, an acrylic, silicone, or urethane-based adhesive material containing a UV absorber and/or a light stabilizer.

For example, in the display apparatus DIS according to the embodiment of FIG. 2, the second adhesive ADH_2 and the third adhesive ADH_3 can contain the UV absorber and/or the light stabilizer. However, in the display apparatus DIS according to this embodiment, only the outermost third adhesive ADH_3 contains the UV absorber and/or the light stabilizer, and the second adhesive ADH_2 does not contain the UV absorber and/or the light stabilizer.

For example, in another embodiment of the present disclosure, a buffer layer BUF can be directly stacked on a bottom surface of the front member TCG. The buffer layer BUF can be formed of an organic material of a urethane material, and can include a UV absorber and/or a light stabilizer. Therefore, in this embodiment, the UV absorber and/or the light stabilizer included in the buffer layer BUF prevent UV rays from being irradiated to the second adhesive ADH_2 below the buffer layer BUF, so that it is possible to prevent cracks from being generated due to the second adhesive ADH_2 being over-hardened.

The buffer layer BUF can be formed to have a thickness t1, 5 µm≤t1≤10 µm. When the thickness t1 of the buffer layer BUF is less than 5 µm, a folding performance of the display apparatus DIS is deteriorated. When it exceeds 10 µm, there is no effect due to the increase in thickness, and only the thickness of the display apparatus DIS is increased.

The buffer layer BUF can contain 3-5 wt % of the UV absorber or 0.5-1 wt % of the light stabilizer in a buffer material. For example, based on 100 wt % of the buffer layer BUF, 3-5 wt % of the UV absorber can be included. For example, based on 100 wt % of the buffer layer BUF, 0.5-1 wt % of the light stabilizer can be included. In addition, the buffer layer BUF can include 3-5 wt % of the UV absorber and 0.5-1 wt % of the light stabilizer in a buffer material.

When the UV absorber is included in an amount of less than 3 wt % in the buffer layer BUF, all incident UV rays cannot be absorbed, and thus the second adhesive ADH_2 is over-hardened by UV rays. In addition, when the UV absorber is included in an amount exceeding 5% in the buffer layer BUF, the buffer layer BUF can be separated from the front member TCG.

When the light stabilizer is included in an amount of less than 0.5 wt % in the buffer layer ADL, the second adhesive ADH_2 is exposed to incident UV rays, and the second adhesive ADH_2 is over-hardened by UV rays. In addition, when the light stabilizer is included in an amount exceeding 1 wt % the buffer layer BUF, the buffer layer BUF can be separated from the front member TCG.

The third adhesive ADH_3 can be formed to have a thickness t2, 20 µm≤t2≤70 µm. When the thickness t2 of the third adhesive ADH_3 is less than 20 µm, an adhesive strength is lowered and the protective film PF can be peeled off from the front member TCG, and when it exceeds 70 µm, a folding performance is deteriorated.

The third adhesive ADH_3 can contain 8-10 wt % of the UV absorber or 1-1.5 wt % of the light stabilizer in an adhesive material. In addition, the third adhesive ADH_3 can include 8-10 wt % of the UV absorber and 1-1.5 wt % of the light stabilizer in an adhesive material.

When the UV absorber is included in an amount of less than 8 wt % in the third adhesive ADH_3, all incident UV rays cannot be absorbed, so that the third adhesive ADH_3 is over-hardened by UV rays. In addition, when the UV absorber is included in an amount of 10 wt % in the third adhesive ADH_3, an adhesive strength of the third adhesive ADH_3 is lowered, so that the protective film PF can be separated from the front member TCG.

When the light stabilizer is included in an amount of less than 1 wt % v in the third adhesive ADH_3, the third adhesive ADH_3 is exposed to incident UV rays, so that the third adhesive ADH_3 is over-hardened by UV rays. In addition, when the light stabilizer is included in an amount exceeding 1.5 wt % in the third adhesive ADH_3, and adhesive strength of the third adhesive ADH_3 is lowered, so that the protective film PF can be separated from the front member TCG.

According to another embodiment of the present disclosure, the UV absorber and/or the light stabilizer is included in the third adhesive ADH_3, which is an outermost adhesive of the display apparatus DIS, to absorb UV rays incident from an outside or not to expose the adhesive material to UV rays, so that defects due to over-hardening of the third adhesive ADH_3 can be prevented.

In addition, in the display apparatus DIS according to another embodiment of the present disclosure, the buffer layer BUF including the UV absorber and/or the light stabilizer is formed on the bottom surface of the front member TCG to prevent defects due to over-hardening of the second adhesive ADH_2. Thus, in the embodiment of the present disclosure of FIG. 4, an outermost structure containing the UV absorber and/or the light stabilizer is the third adhesive ADH_3, which is located closer to the display panel PNL than the black matrix BM, and layers such as front member TCG, and the polarization plate POL located to the interior of the display apparatus DIS are protected from UV rays by the third adhesive ADH_3. Further, the polarization plate POL is further protected from the UV rays by the buffer layer BUF containing the UV absorber and/or the light stabilizer. As shown in the embodiment of FIG. 4, both of the third adhesive ADH_3 and the buffer layer BUF containing the UV absorber and/or the light stabilizer are located to the interior of the black matrix BM in FIG. 4.

FIG. 5 is a view illustrating a display apparatus according to yet another embodiment of the present disclosure. Explanations of the same components as those of the embodiment shown in FIG. 2 can be omitted or simplified, and other structures can be explained in detail.

As shown in FIG. 5, the display apparatus DIS according to yet another embodiment of the present disclosure can include a display panel PNL on which an image is displayed, a polarizing plate POL disposed on the display panel PNL to prevent reflection of external light incident from an outside, a front member TCG disposed on the polarizing plate POL, a protective film PF disposed on the front member TCG, and a coating layer HC and a functional layer AF disposed on the protective film PF.

The polarizing plate POL can be attached to the display panel PNL by a first adhesive ADH_1. An adhesive layer ADL can be laminated on a bottom surface of the front member TCG, so that the front member TCG can be attached to the polarizing plate POL. In addition, the protective film PF can be attached to the front member TCG by a second adhesive ADH_2. In addition, the coating layer HC can be directly laminated on the protective film PF, and the functional layer AF can be directly laminated on the coating layer HC.

The first adhesive ADH_1 and the second adhesive ADH_2 may not be directly laminated on objects to be bonded, but can be formed in a form of a film, and one surface of this adhesive film can be attached to one object and the other surface of the adhesive film can be attached to the other object and then by applying pressure to the objects, the objects can be bonded to each other. On the other hand, the adhesive layer ADL can be directly coated on the bottom surface of the front member TCG to attach the front member TCG to the polarizing plate POL.

The first adhesive (ADH_1) for bonding the display panel PNL and the polarizing plate (POL) can be, but not limited to, an acrylic, silicone or urethane-based adhesive material. The second adhesive ADH_2 for bonding the front member TCG and the protective film PF can use an acrylic, silicone, and urethane-based adhesive material containing a UV absorber and/or a light stabilizer to prevent the second adhesive ADH_2 from being damaged by UV rays.

The adhesive layer ADL can be formed by directly coating a urethane-based adhesive material containing a UV absorber and/or a light stabilizer to the bottom surface of the front member TCG. The UV absorber and the light stabilizer of the adhesive layer ADL can absorb UV rays irradiated to the adhesive layer ADL or prevent the adhesive material of the adhesive layer ADL from being exposed to UV rays, thereby preventing the adhesive layer ADL from being over-hardened and damaged.

The adhesive layer ADL can be formed to have a thickness t1, 5 µm≤t1≤10 µm. When the thickness t1 of the adhesive layer ADL is less than 5 µm, a folding performance of the display apparatus DIS is deteriorated.

The adhesive layer ADL can include 3-5 wt % of the UV absorber or 0.5-1 wt % of the light stabilizer in an adhesive material. For example, based on 100 wt % of the adhesive layer ADL, the UV absorber can be included in an amount of 3-5 wt %. For example, based on 100 wt % of the adhesive layer ADL, the light stabilizer can be included in an amount of 0.5-1 wt %.

In addition, the adhesive layer ADL can include 3-5 wt % of the UV absorber and 0.5-1 wt % of the light stabilizer in an adhesive material.

When the UV absorber is included in an amount of less than 3 wt % in the adhesive layer ADL, all incident UV rays cannot be absorbed, so that the adhesive layer ADL is over-hardened by UV rays. In addition, when the UV absorber is included in an amount exceeding 5 wt % in the adhesive layer ADL, an adhesive strength of the adhesive layer ADL can be lowered, and thus the front member TCG can be separated from the polarizing plate POL.

When the light stabilizer is included in an amount of less than 0.5 wt % in the adhesive layer ADL, the adhesive layer ADL is exposed to incident UV rays, and the adhesive layer ADL is over-hardened by UV rays. In addition, when the light stabilizer is included in an amount exceeding 1 wt % in the adhesive layer ADL, the front member TCG can be separated from the polarizing plate POL.

The second adhesive ADH_2 can be formed to have a thickness t2, 20 µm≤t2≤70 µm. When the thickness t2 of the second adhesive ADH_2 is less than 20 µm, an adhesive strength is lowered and the protective film PF can be peeled off from the front member TCG, and when it exceeds 70 µm, a folding performance is deteriorated.

The second adhesive ADH_2 can include 8-10 wt % of the UV absorber or 1-1.5 wt % of the light stabilizer in an adhesive material. For example, based on 100 wt % of the second adhesive ADH_2, the UV absorber can be included in an amount of 8-10 wt %. For example, based on 100 wt % of the second adhesive ADH_2, the light stabilizer can be included in an amount of 1-1.5 wt %.

In addition, the second adhesive ADH_2 can include 8-10 wt % of the UV absorber and 1-1.5 wt % of the light stabilizer in an adhesive material.

When the UV absorber is included in an amount of less than 8 wt % in the second adhesive ADH_2, all incident UV rays cannot be absorbed, so that the second adhesive ADH_2 is over-hardened by UV rays. In addition, when the UV absorber is included in an amount exceeding 10 wt % in the second adhesive ADH_2, an adhesive strength of the second adhesive ADH_2 is lowered, so that the protective film PF can be separated from the front member TCG.

When the light stabilizer is included in an amount of less than 1 wt % in the second adhesive ADH_2, the second adhesive ADH_2 is exposed to incident UV rays, so that the second adhesive ADH_2 is over-hardened by UV rays. In addition, when the light stabilizer is included in an amount exceeding 1.5 wt % in the second adhesive ADH_2, an adhesive strength of the second adhesive ADH_2 is lowered, so that the protective film PF can be separated from the front member TCG.

According to yet another embodiment of the present disclosure, the UV absorber and/or the light stabilizer is included in the second adhesive ADH_2, which is an outermost adhesive of the display apparatus DIS, to absorb UV rays incident from an outside or not to expose the adhesive material to UV rays, so that defects due to over-hardening of the second adhesive ADH_2 can be prevented.

In addition, in the display apparatus DIS according to yet another embodiment of the present disclosure, the adhesive layer ADL including the UV absorber and/or the light stabilizer is formed on the bottom surface of the front member TCG to prevent defects due to over-hardening of the adhesive layer ADL. Thus, in the embodiment of the present disclosure of FIG. 5, an outermost structure containing the UV absorber and/or the light stabilizer is the second adhesive ADH_2, which is located closer to the display panel PNL than the black matrix BM, and layers such as front member TCG, and the polarization plate POL located to the interior of the display apparatus DIS are protected from UV rays by the second adhesive ADH_2. Further, the polarization plate POL is further protected from the UV rays by the adhesive layer containing the UV absorber and/or the light stabilizer. As shown in the embodiment of FIG. 5, both of the second adhesive ADH_2 and the adhesive layer ADL containing the UV absorber and/or the light stabilizer are located to the interior of the black matrix BM in FIG. 5.

Figures 6, 7:
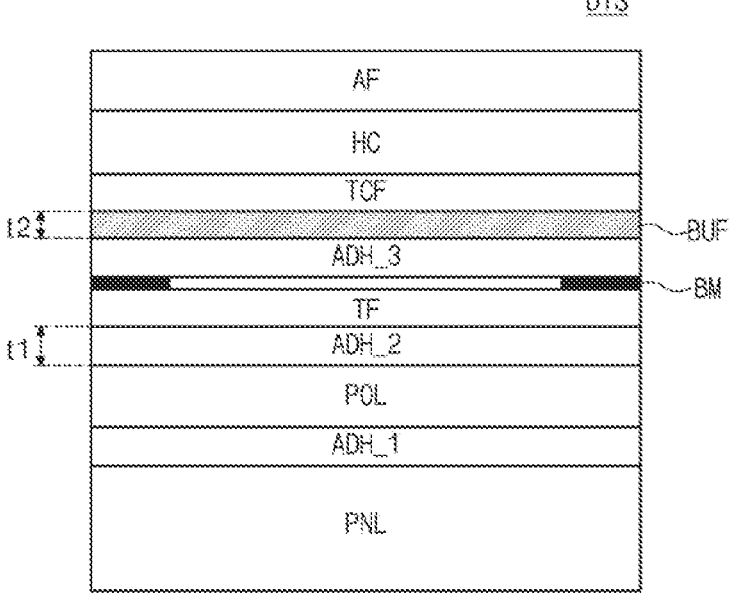
FIG. 6 is a cross-sectional view illustrating a display apparatus according to yet another embodiment of the present disclosure.
FIG. 7 is a cross-sectional view illustrating a display apparatus according to yet another embodiment of the present disclosure.

FIG. 6 is a view illustrating a display apparatus according to yet another embodiment of the present disclosure. Explanations of the same components as those of the embodiment shown in FIG. 2 can be omitted or simplified, and other structures can be explained in detail.

As shown in FIG. 6, a display apparatus DIS according to yet another embodiment of the present disclosure can include a display panel PNL on which an actual image is displayed, a polarizing plate POL disposed on the display panel PNL to prevent reflection of external light incident from an outside, a first film TF disposed on the polarizing plate POL, a second film TCF disposed on the first film TF, and a coating layer HC and a functional layer AF disposed on the second film TCF.

The polarizing plate POL can be attached to the display panel PNL by a first adhesive ADH_1, the first film TF can be attached to the polarizing plate POL by a second adhesive ADH_2, and the second film TCF can be attached to the first film TF by a third adhesive ADH_3. In addition, the coating layer HC can be directly laminated on the second film TCF, and the functional layer AF can be directly laminated on the coating layer HC.

The first film TF can mainly use a film of, for example, but not limited to, polyethylene terephthalate. Alternatively, the first film TF can use triacetyl cellulose, cycloolefin polymer, or a combination thereof.

A black matrix BM can be formed on an edge of the first film TF to prevent light output from the display panel PNL from leaking to an edge of the display apparatus DIS. In this case, the black matrix BM can be formed of a metal oxide such as CrOx, a black resin, or black ink, but is not limited thereto.

The second film TCF can be formed of CPI (color polyimide), and can transmits an image of the display panel PNL to an outside as it is, and can protect the display panel PNL from external impact and external environment or stress.

The first adhesive ADH_1 for bonding the display panel PNL and the polarizing plate POL can use an acryl, silicone, or urethane-based adhesive material.

In addition, the second adhesive ADH_2 for bonding the polarizing plate POL and the first film TF and the third adhesive ADH_3 for bonding the first film TF and the second film TCF can an acrylic, silicone or urethane-based adhesive material containing a UV absorber and/or a light stabilizer.

In the display apparatus DIS according to yet another example embodiment of the present disclosure, the outermost third adhesive ADH_3 and the second adhesive ADH_2 therebelow can contain the UV absorber and/or the light stabilizer, and the lowermost first adhesive ADH_1 may not contain the UV absorber and/or the light stabilizer.

Accordingly, in yet another embodiment of the present disclosure, the UV absorber and/or the light stabilizer included in the second adhesive ADH_2 and the third adhesive ADH_3 absorb UV rays and prevent the second adhesive ADH_2 and the third adhesive ADH_3 from being exposed to UV rays, so that it is possible to prevent cracks from being generated due to the second adhesive ADH_2 and the third adhesive ADH_3 being over-hardened.

The second adhesive ADH_2 can be formed to have a thickness t1, 50 μm≤t1≤100 μm. When the thickness t1 of the second adhesive ADH_2 is less than 50 μm, a folding performance of the display apparatus DIS is deteriorated. When it exceeds 100 μm, there is no effect due to the increase in thickness, and only the thickness of the display apparatus DIS is increased.

The second adhesive ADH_2 can include 3-5 wt % of the UV absorber or 0.5-1 wt % of the light stabilizer in an adhesive material. For example, based on 100 wt % of the second adhesive ADH_2, the UV absorber can be included in an amount of 3-5 wt %. For example, based on 100 wt % of the second adhesive ADH_2, the light stabilizer can be included in an amount of 0.5-1 wt %.

In addition, the second adhesive ADH_2 can include both 3-5 wt % of the UV absorber and 0.5-1 wt % of the light stabilizer in an adhesive material. When the UV absorber is included in an amount of less than 3 wt % in the second adhesive ADH_2, all incident UV rays cannot be absorbed, so that the second adhesive ADH_2 is over-hardened by UV rays. In addition, when the UV absorber is included in an amount exceeding 5 wt % in the second adhesive ADH_2, an adhesive strength of the second adhesive ADH_2 is lowered, so that the first film TF can be separated from the polarizing plate POL.

When the light stabilizer is included in an amount of less than 0.5 wt % in the second adhesive ADH_2, the second adhesive ADH_2 is exposed to incident UV rays and the second adhesive (ADH_2) is over-hardened by UV rays. In addition, when the light stabilizer is included in an amount exceeding 1 wt % in the second adhesive ADH_2, an adhesive strength of the second adhesive ADH_2 is lowered, so that the first film TF can be separated from the polarizing plate POL.

The third adhesive ADH_3 can be formed to have a thickness t2, 20 μm≤t2≤70 μm. When the thickness t2 of the third adhesive ADH_3 is less than 20 μm, an adhesive strength is lowered and the second film TCF can be peeled off from the first film TF, and when it exceeds 70 μm, a folding performance is deteriorated.

The third adhesive ADH_3 can contain 8-10 wt % of the UV absorber or 1-1.5 wt % of the light stabilizer in an adhesive material. For example, based on 100 wt % of the third adhesive ADH_3, the UV absorber can be included in an amount of 8-10 wt %. For example, based on 100 wt % of the third adhesive ADH_3, the light stabilizer can be included in an amount of 1-1.5 wt %.

In addition, the third adhesive ADH_3 can include 8-10 wt % of the UV absorber and 1-1.5 wt % of the light stabilizer in an adhesive material.

When the UV absorber is included in an amount of less than 8 wt % of the third adhesive ADH_3, all incident UV rays cannot be absorbed, so that the third adhesive ADH_3 is over-hardened by UV rays. In addition, when the UV absorber is included in an amount exceeding 10 wt % in the third adhesive ADH_3, an adhesive strength of the third adhesive ADH_3 is lowered, so that the second film TCF can be separated from the first film TF.

When the light stabilizer is included in an amount of less than 1 wt % in the third adhesive ADH_3, the third adhesive ADH_3 is exposed to incident UV rays, so that the third adhesive ADH_3 is over-hardened by UV rays. In addition, when the light stabilizer is included in an amount exceeding 1.5 wt % in the third adhesive ADH_3, an adhesive strength of the third adhesive ADH_3 is lowered, so that the second film TCF can be separated from the first film TF.

According to yet another embodiment of the present disclosure, the UV absorber and/or the light stabilizer is included in the third adhesive ADH_3, which is an outermost adhesive of the display apparatus DIS, to absorb UV rays incident from an outside or not to expose the adhesive material to UV rays, so that defects due to over-hardening of the third adhesive ADH_3 can be prevented.

In addition, in the display apparatus DIS according to this embodiment of the present disclosure, the second adhesive ADH_2 located at an inner side than the outermost adhesive contains the UV absorber and/or the light stabilizer to prevent defects due to over-hardening of the second adhesive ADH_2. Thus, in the embodiment of the present disclosure of FIG. 6, an outermost structure containing the UV absorber and/or the light stabilizer is the third adhesive ADH_3, which is located farther to the display panel PNL than the black matrix BM, and layers such as the black matrix BM, the first film TF, and the polarization plate POL located to the interior of the display apparatus DIS are protected from UV rays by the third adhesive ADH_3, and the polarization plate POL is further protected from the UV rays by the second adhesive ADH_2 containing the UV absorber and/or the light stabilizer. As shown in the embodiment of FIG. 6, the third adhesive ADH_3 is located to the exterior of the black matrix BM, and the second adhesive ADH_2 is located to the interior of the black matrix BM.

FIG. 7 is a view illustrating a display apparatus according to yet another embodiment of the present disclosure. Explanations of the same components as those of the embodiment shown in FIG. 6 can be omitted or simplified, and other structures can be explained in detail.

As shown in FIG. 7, a display apparatus DIS according to yet another embodiment of the present disclosure can include a display panel PNL on which an actual image is displayed, a polarizing plate POL disposed on the display panel PNL to prevent reflection of external light incident from an outside, a first film TF disposed on the polarizing plate POL, a second film TCF disposed on the first film TF, and a coating layer HC and a functional layer AF disposed on the second film TCF.

The polarizing plate POL can be attached to the display panel PNL by a first adhesive ADH_1, the first film TF can be attached to the polarizing plate POL by a second adhesive ADH_2, and the second film TCF can be attached to the first film TF by a third adhesive ADH_3. In addition, the coating layer HC can be directly laminated on the second film TCF, and the functional layer AF can be directly laminated on the coating layer HC.

The first adhesive ADH_1 for bonding the display panel PNL and the polarizing plate POL and the third adhesive ADH_3 for bonding the second film TCF and the first film TF can use an acrylic, silicone, and urethane-based adhesive material, and may not contain a UV absorber and/or a light stabilizer.

On the other hand, the second adhesive ADH_2 for bonding the polarizing plate POL and the first film TF can contains a UV absorber and/or a light stabilizer.

Therefore, in yet another embodiment of the present disclosure, the UV absorber and/or the light stabilizer included in the second adhesive ADH_2 absorb UV rays and prevent the second adhesive ADH_2 from being exposed to UV rays ADH_2, so that it is possible to prevent cracks from being generated due to the second adhesive ADH_2 being over-hardened.

In addition, in the display apparatus DIS according to yet another embodiment of the present disclosure, a buffer layer BUF can be directly laminated on the bottom surface of the second film TCF. The buffer layer BUF can be formed of an organic material of a urethane material, and can include a UV absorber and/or a light stabilizer. Therefore, in this embodiment, the UV absorber and/or the light stabilizer included in the buffer layer BUF prevent UV rays from being irradiated to the third adhesive ADH_3 below the buffer layer BUF, so that it is possible to prevent cracks from being generated due to the third adhesive ADH_3 being over-hardened.

The second adhesive ADH_2 can be formed to have a thickness t1, 50 μm≤t1≤100 μm. When the thickness t1 of the second adhesive ADH_2 is less than 50 μm, a folding performance of the display apparatus DIS is deteriorated. When it exceeds 100 μm, there is no effect due to the increase in thickness, and only the thickness of the display apparatus DIS is increased.

The second adhesive ADH_2 can include 3-5 wt % of the UV absorber or 0.5-1 wt % of the light stabilizer in an adhesive material. For example, based on 100 wt % of the second adhesive ADH_2, the UV absorber can be included in an amount of 3-5 wt %. For example, based on 100 wt % of the second adhesive ADH_2, the light stabilizer can be included in an amount of 0.5-1 wt %.

In addition, the second adhesive ADH_2 can include 3-5 wt % of the UV absorber and 0.5-1 wt % of the light stabilizer in an adhesive material.

When the UV absorber is included in an amount of less than 3 wt % in the second adhesive ADH_2, all incident UV rays cannot be absorbed, so that the second adhesive ADH_2 is over-hardened by UV rays. In addition, when the UV absorber is included in an amount exceeding 5 wt % in the second adhesive ADH_2, an adhesive strength of the second adhesive ADH_2 is lowered, so that the first film TF can be separated from the polarizing plate POL.

When the light stabilizer is included in an amount of less than 0.5 wt % in the second adhesive ADH_2, the second adhesive ADH_2 is exposed to incident UV rays and the second adhesive ADH_2 is over-hardened by UV rays. In addition, when the light stabilizer is included in an amount exceeding 1 wt % in the second adhesive ADH_2, an adhesive strength of the second adhesive ADH_2 is lowered, so that the first film TF can be separated from the polarizing plate POL.

The buffer layer BUF can be formed to have a thickness t2, 5 μm≤t2≤10 μm. When the thickness t2 of the buffer layer BUF is less than 5 μm, a folding performance of the display apparatus DIS is deteriorated. When it exceeds 10 μm, there is no effect due to the increase in thickness, and only the thickness of the display device DIS is increased.

The buffer layer BUF can include 8-10 wt % of a UV absorber or 1-1.5 wt % of a light stabilizer in an organic material of a urethane material. For example, based on 100 wt % of the buffer layer BUF, the UV absorber can be included in an amount of 8-10 wt %. For example, based on 100 wt % of the buffer layer BUF, the light stabilizer can be included in an amount of 1-1.5 wt %.

In addition, the buffer layer BUF can include 8-10 wt % of the UV absorber and 1-1.5 wt % of the light stabilizer in an organic material.

When the UV absorber is included in an amount of less than 8 wt % in the buffer layer BUF, all incident UV rays cannot be absorbed, so that the third adhesive ADH_3 below the buffer layer is over-hardened by UV rays.

In addition, when the UV absorber is included in an amount exceeding 10 wt % in the buffer layer BUF, the buffer layer BUF can be separated from the second film TCF.

When the light stabilizer is included in an amount of less than 1 wt % in the buffer layer BUF, the third adhesive ADH_3 is exposed to incident UV rays, and the third adhesive ADH_3 is over-hardened by UV rays. In addition, when the light stabilizer is included in an amount exceeding 1.5 wt % in the buffer layer BUF, the buffer layer BUF can be separated from the second film TCF.

According to yet another embodiment of the present disclosure, the buffer layer BUF including the UV absorber and/or the light stabilizer is formed on the bottom surface of the second film TCF of the display apparatus DIS, so that defects due to over-hardening of the third adhesive ADH_3 below the buffer layer BUF can be prevented.

In addition, the second adhesive ADH_2 includes the UV absorber and/or the light stabilizer to absorb UV rays incident from an outside or not to expose the adhesive material to UV rays, so that defects due to over-hardening of the second adhesive ADH_2 can be prevented. Thus, in the embodiment of the present disclosure of FIG. 7, an outermost structure containing the UV absorber and/or the light stabilizer is the buffer layer BUF, which is located farther to the display panel PNL than the black matrix BM, and layers such as the black matrix BM, the first film TF, and the polarization plate POL located to the interior of the display apparatus DIS are protected from UV rays by the buffer layer BUF. Further, the polarization plate POL is further protected from the UV rays by the second adhesive ADH_2 containing the UV absorber and/or the light stabilizer. As shown in the embodiment of FIG. 7, the buffer layer BUF is located to the exterior of the black matrix BM, and the second adhesive ADH_2 is located to the interior of the black matrix BM.

Also, when a first adhesive ADH_1, a second adhesive ADH_2, a third adhesive ADH_3, a buffer layer BUF and an adhesive layer ADL are provided, a thickness of one of these layers can be different from a thickness of another layer. In this instance, an amount of the UV absorber and an amount of the light stabilizer of the one of these layers can be greater than or less than those of the another layer.

The display apparatus according to the embodiments of the present disclosure can be described as follows.

The display apparatus according to the embodiments of the present disclosure includes a display panel displaying an image, a polarizing plate disposed on the display panel, a front member disposed on the polarizing plate, a protective film disposed on the front member, and a first adhesive disposed between the front member and the protective film, wherein the first adhesive includes a UV absorber and/or a light stabilizer.

According to some embodiments of the present disclosure, a second adhesive disposed between the polarizing plate and the front member, and a third adhesive disposed between the display panel and the polarizing plate can be further included.

According to some embodiments of the present disclosure, the second adhesive can include a UV absorber and/or a light stabilizer.

According to some embodiments of the present disclosure, a content of the UV absorber and/or the light stabilizer included in the first adhesive can be greater than that of the UV absorber and/or the light stabilizer included in the second adhesive.

According to some embodiments of the present disclosure, the UV absorber of the first adhesive can have 8 to 10 wt %, and the light stabilizer of the first adhesive can have 1 to 1.5 wt %.

According to some embodiments of the present disclosure, the UV absorber of the second adhesive can have 3 to 5 wt %, and the light stabilizer of the second adhesive can have 0.5 to 1 wt %.

According to some embodiments of the present disclosure, a buffer layer disposed on a bottom surface of the front member can be further included.

According to some embodiments of the present disclosure, the buffer layer can include a UV absorber and/or a light stabilizer.

According to some embodiments of the present disclosure, the UV absorber of the buffer layer can have 3 to 5 wt %, and the light stabilizer of the buffer layer can have 0.5 to 1 wt %.

According to some embodiments of the present disclosure, an adhesive layer disposed on a bottom surface of the front member, and a second adhesive disposed between the display panel and the polarizing plate can be further included.

According to some embodiments of the present disclosure, the adhesive layer can include a UV absorber and/or a light stabilizer.

According to some embodiments of the present disclosure, the UV absorber of the adhesive layer can have 3 to 5 wt %, and the light stabilizer of the adhesive layer can have 0.5 to 1 wt %.

According to some embodiments of the present disclosure, a black matrix disposed on an edge region of a bottom surface of the protective film, a coating layer disposed on the protective film, and a functional layer disposed on the coating layer can be further included.

According to some embodiments of the present disclosure, the functional layer can include at least one of an anti-fingerprint layer, an anti-contamination layer, and an anti-glare layer.

The display apparatus according to the embodiments of the present disclosure includes a display panel displaying an image, a polarizing plate disposed on the display panel, a first film disposed on the polarizing plate, a second film disposed on the first film, and a first adhesive disposed between the first film and the second film, wherein the first adhesive includes a UV absorber and/or a light stabilizer.

According to some embodiments of the present disclosure, a second adhesive disposed between the polarizing plate and the first film, and a third adhesive disposed between the display panel and the polarizing plate can be further included.

According to some embodiments of the present disclosure, the second adhesive can include a UV absorber and/or a light stabilizer.

According to some embodiments of the present disclosure, an amount of the UV absorber and/or the light stabilizer included in the first adhesive can be greater than that of the UV absorber and/or the light stabilizer included in the second adhesive.

According to some embodiments of the present disclosure, the UV absorber of the first adhesive can have 8 to 10 wt %, and the light stabilizer of the first adhesive can have 1 to 1.5 wt %.

According to some embodiments of the present disclosure, the UV absorber of the second adhesive can have 3 to 5 wt %, and the light stabilizer of the second adhesive can have 0.5 to 1 wt %.

According to some embodiments of the present disclosure, a buffer layer disposed on a bottom surface of the second film can be further included.

According to some embodiments of the present disclosure, the buffer layer can include a UV absorber and/or a light stabilizer.

According to some embodiments of the present disclosure, the UV absorber of the buffer layer can have 8 to 10 wt %, and the light stabilizer of the buffer layer can have 1 to 1.5 wt %.

According to some embodiments of the present disclosure, a black matrix disposed on an edge region of a bottom surface of the first film, a coating layer disposed on the second film, and a functional layer disposed on the coating layer can be further included.

According to some embodiments of the present disclosure, the functional layer can include at least one of an anti-fingerprint layer, an anti-contamination layer, and an anti-glare layer.

According to some embodiments of the present disclosure, a display apparatus can include a plurality of layers including a display panel, a polarizing plate, a front member, and a protective film; and at least two of a first adhesive, a second adhesive, a buffer layer and an adhesive layer each having an ultraviolet (UV) absorber and a light stabilizer included in different amounts, wherein a thickness of first of the at least two is different from a thickness of second of the two.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
a display panel configured to display an image;
a polarizing plate on the display panel;
a front member on the polarizing plate;
a protective film on the front member; and
a first adhesive between the front member and the protective film,
   wherein the first adhesive includes at least one of an ultraviolet (UV) absorber and a light stabilizer.

2. The display apparatus of claim 1, further comprising:
a second adhesive between the polarizing plate and the front member; and
a third adhesive between the display panel and the polarizing plate.

3. The display apparatus of claim 2, wherein the second adhesive includes at least one of the UV absorber and the light stabilizer.

4. The display apparatus of claim 3, wherein a content of the at least one of the UV absorber and the light stabilizer included in the first adhesive is greater than that of the at least one of the UV absorber and the light stabilizer included in the second adhesive.

5. The display apparatus of claim 4, wherein the UV absorber of the first adhesive is about 8 to 10 wt %, and the light stabilizer of the first adhesive is about 1 to 1.5 wt % of the first adhesive.

6. The display apparatus of claim 4, wherein the UV absorber of the second adhesive is about 3 to 5 wt %, and the light stabilizer of the second adhesive is about 0.5 to 1 wt % of the second adhesive.

7. The display apparatus of claim 2, further comprising a buffer layer on a bottom surface of the front member.

8. The display apparatus of claim 7, wherein the buffer layer includes at least one of a UV absorber and a light stabilizer.

9. The display apparatus of claim 8, wherein the UV absorber of the buffer layer is about 3 to 5 wt %, and the light stabilizer of the buffer layer is about 0.5 to 1 wt % of the buffer layer.

10. The display apparatus of claim 1, further comprising:
an adhesive layer on a bottom surface of the front member; and
a second adhesive between the display panel and the polarizing plate.

11. The display apparatus of claim 10, wherein the adhesive layer includes at least one of a UV absorber and a light stabilizer.

12. The display apparatus of claim 11, wherein the UV absorber of the adhesive layer is about 3 to 5 wt %, and the light stabilizer of the adhesive layer is about 0.5 to 1 wt % of the adhesive layer.

13. The display apparatus of claim 1, further comprising:
a black matrix on an edge region of a bottom surface of the protective film;

a coating layer on the protective film; and
a functional layer on the coating layer.

14. The display apparatus of claim 13, wherein the functional layer includes at least one of an anti-fingerprint layer, an anti-contamination layer, and an anti-glare layer.

15. A display apparatus, comprising:
a display panel configured to display an image;
a polarizing plate on the display panel;
a first film on the polarizing plate;
a second film on the first film; and
a first adhesive between the first film and the second film,
   wherein the first adhesive includes at least one of an ultraviolet (UV) absorber and a light stabilizer.

16. The display apparatus of claim 15, further comprising:
a second adhesive between the polarizing plate and the first film; and
a third adhesive between the display panel and the polarizing plate.

17. The display apparatus of claim 16, wherein the second adhesive includes at least one of a UV absorber and a light stabilizer.

18. The display apparatus of claim 17, wherein an amount of the at least one of the UV absorber and the light stabilizer included in the first adhesive is greater than that of the at least one of the UV absorber and the light stabilizer included in the second adhesive.

19. The display apparatus of claim 18, wherein the UV absorber of the first adhesive is about 8 to 10 wt %, and the light stabilizer of the first adhesive is about 1 to 1.5 wt % of the first adhesive.

20. The display apparatus of claim 18, wherein the UV absorber of the second adhesive is about 3 to 5 wt %, and the light stabilizer of the second adhesive is about 0.5 to 1 wt % of the second adhesive.

21. The display apparatus of claim 15, further comprising a buffer layer on a bottom surface of the second film.

22. The display apparatus of claim 21, wherein the buffer layer includes at least one of a UV absorber and a light stabilizer.

23. The display apparatus of claim 22, wherein the UV absorber of the buffer layer is about 8 to 10 wt %, and the light stabilizer of the buffer layer is about 1 to 1.5 wt % of the buffer layer.

24. The display apparatus of claim 15, further comprising:
a black matrix on an edge region of a bottom surface of the first film;
a coating layer on the second film; and
a functional layer on the coating layer.

25. The display apparatus of claim 24, wherein the functional layer includes at least one of an anti-fingerprint layer, an anti-contamination layer, and an anti-glare layer.

26. A display apparatus, comprising:
a plurality of layers including a display panel, a polarizing plate, a front member, and a protective film; and
at least two of a first adhesive, a second adhesive, a buffer layer, and a third adhesive each having an ultraviolet (UV) absorber and a light stabilizer included in different amounts,
   wherein a thickness of first of the at least two is different from a thickness of second of the at least two.

27. The display apparatus of claim 26, wherein the first of the at least two is closer to the display panel than the second of the at least two, and
   wherein an amount of the UV absorber and an amount of the light stabilizer in the second of the at least two is greater than those of the first of the at least two.

28. The display apparatus of claim 27, wherein, in the second of the at least two, the amount of the UV absorber is about 8 to 10 wt % and the amount of the light stabilizer is about 1 to 1.5 wt %, and wherein in the first of the at least two, the amount of the UV absorber is about 3 to 5 wt % and the amount of the light stabilizer is about 0.5 to 1.0 wt %.

29. The display apparatus of claim 28, wherein the thickness of the second of the at least two is less than the thickness of the first of the at least two.

30. The display apparatus of claim 29, wherein the thickness of the second of the at least two is about 20 μm to 70 μm, and the thickness of the first of the at least two is about 50 μm to 100 μm.

31. The display apparatus of claim 30, wherein the second of the at least two is the second adhesive and the first of the at least two is the first adhesive.

32. The display apparatus of claim 29, wherein the thickness of the second of the at least two is about 5 μm to 10 μm, and the thickness of the first of the at least two is about 50 μm to 100 μm.

33. The display apparatus of claim 32, wherein the second of the at least two is the buffer layer, and the first of the at least two is the first adhesive.

34. The display apparatus of claim 28, wherein the thickness of the second of the at least two is greater than the thickness of the first of the at least two.

35. The display apparatus of claim 34, wherein the thickness of the second of the at least two is about 20 μm to 70 μm, and the thickness of the first of the at least two is about 5 μm to 10 μm.

36. The display apparatus of claim 35, wherein the second of the at least two is the first adhesive or the second adhesive, and the first of the least two is the buffer layer or the third adhesive.

\* \* \* \* \*